United States Patent
Waters (10) Patent No.: US 10,692,674 B2
(45) Date of Patent: Jun. 23, 2020

(54) PORT CONTROLLER WITH POWER CONTRACT NEGOTIATION CAPABILITY

(71) Applicant: TEXAS INSTRUMENTS INCORPORATED, Dallas, TX (US)

(72) Inventor: Deric Wayne Waters, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 328 days.

(21) Appl. No.: 15/350,609

(22) Filed: Nov. 14, 2016

(65) Prior Publication Data

US 2017/0140887 A1    May 18, 2017

Related U.S. Application Data

(60) Provisional application No. 62/254,936, filed on Nov. 13, 2015.

(51) Int. Cl.
| | |
|---|---|
| *H01H 47/00* | (2006.01) |
| *G06F 1/26* | (2006.01) |
| *G01R 19/165* | (2006.01) |
| *G01R 31/40* | (2020.01) |
| *H01R 24/28* | (2011.01) |
| *H01R 24/60* | (2011.01) |

(Continued)

(52) U.S. Cl.
CPC ....... *H01H 47/00* (2013.01); *G01R 19/16576* (2013.01); *G01R 31/40* (2013.01); *G06F 1/266* (2013.01); *H01R 24/28* (2013.01); *H01R 24/60* (2013.01); *H01R 2107/00* (2013.01); *H02J 7/00* (2013.01)

(58) Field of Classification Search
CPC ... G01R 19/16576; G01R 31/40; G06F 1/266; G06F 1/189; G06F 1/26; H01H 47/00; H01R 24/28; H01R 24/60; H01R 2107/00; H02J 2007/0062; H02J 1/102; H02J 1/14
USPC .......................................................... 309/28
See application file for complete search history.

(56) References Cited

U.S. PATENT DOCUMENTS

| | | | |
|---|---|---|---|
| 6,907,042 B1 | 6/2005 | Oguchi | |
| 9,541,976 B1 * | 1/2017 | Lambert | ................... G06F 1/26 |

(Continued)

OTHER PUBLICATIONS

"USB Charging Port Controller and Power Switch with Load Detection", Texas Instruments, TPS2546, SLVSbJ2A, Feb. 2013, Revised Feb. 2013, 40 pgs.

(Continued)

*Primary Examiner* — Thienvu V Tran
*Assistant Examiner* — Brian K Baxter
(74) *Attorney, Agent, or Firm* — Michael A. Davis, Jr.; Charles A. Brill; Frank D. Cimino (57) ABSTRACT

At least some embodiments are directed to an electronic device port system comprising a first device configured to negotiate power supply contracts from a power source via a universal serial bus (USB) cable. The system also comprises a second device configured to negotiate power supply contracts from the power source via the USB cable when the first device is unable to negotiate power supply contracts from the power source. The second device is configured to activate a switch after the second device negotiates a power supply contract with the power source. The switch is configured to permit the provision of power from the power source to a battery system of the electronic device per the negotiated power supply contract.

20 Claims, 4 Drawing Sheets

(51) Int. Cl.
*H02J 7/00* (2006.01)
*H01R 107/00* (2006.01)

(56) References Cited

U.S. PATENT DOCUMENTS

| | | | |
|---|---|---|---|
| 9,864,421 B2* | 1/2018 | Li | G06F 1/26 |
| 2006/0117195 A1 | 6/2006 | Niwa et al. | |
| 2006/0190745 A1 | 8/2006 | Matsushima et al. | |
| 2006/0218415 A1 | 9/2006 | Mak-Fan et al. | |
| 2008/0162737 A1 | 7/2008 | Liu et al. | |
| 2008/0244282 A1 | 10/2008 | Hansalia et al. | |
| 2010/0275037 A1 | 10/2010 | Lee et al. | |
| 2011/0279095 A1* | 11/2011 | Hong | G06F 13/385 320/164 |
| 2013/0073758 A1 | 3/2013 | Chang et al. | |
| 2013/0290765 A1* | 10/2013 | Waters | G06F 1/263 713/340 |
| 2014/0122909 A1 | 5/2014 | Hawawini et al. | |
| 2015/0137789 A1 | 5/2015 | Furtner | |
| 2015/0338894 A1* | 11/2015 | Cohen | G06F 1/263 713/310 |
| 2016/0139640 A1* | 5/2016 | Hijazi | G06F 1/26 361/679.31 |
| 2016/0139641 A1* | 5/2016 | Hijazi | G06F 1/26 361/679.31 |
| 2016/0139642 A1* | 5/2016 | Hijazi | G06F 1/26 361/679.31 |
| 2016/0163480 A1* | 6/2016 | Lester | G06F 13/00 713/300 |
| 2016/0179155 A1* | 6/2016 | Lester | G06F 1/266 713/300 |
| 2016/0179648 A1* | 6/2016 | Srivastava | G06F 11/3051 710/16 |
| 2016/0202743 A1* | 7/2016 | Li | G06F 1/26 710/313 |
| 2016/0285757 A1* | 9/2016 | Srivastava | H04L 12/10 |
| 2016/0352101 A1* | 12/2016 | Koo | H02J 1/12 |
| 2016/0364360 A1* | 12/2016 | Lim | G06F 13/385 |
| 2017/0005648 A1* | 1/2017 | Chiu | H03K 17/002 |
| 2017/0093173 A1* | 3/2017 | Chua | H02J 7/0052 |
| 2017/0102736 A1* | 4/2017 | Peng | G06F 1/1632 |
| 2017/0102753 A1* | 4/2017 | Lambert | G06F 1/26 |
| 2017/0109312 A1* | 4/2017 | Voor | G06F 13/4282 |
| 2017/0293338 A1* | 10/2017 | Lester | G06F 1/266 |
| 2019/0236047 A1* | 8/2019 | Lim | G06F 13/4282 |

OTHER PUBLICATIONS

"Universal Serial Bus Power Delivery Specification", Revision 2.0, V1.0, Aug. 11, 2014, Section 2—Overview, cover sheet and pp. 41-56.
"Universal Serial Bus Power Delivery Specification", Revision 2.0, V1.0, Aug. 11, 2014, Section 5—Physical Layer, pp. 102-140.
"Universal Serial Bus Power Delivery Specification", Revision 2.0, V1.0, Aug. 11, 2014, Section 6—Protocol Layer, pp. 141-207.
"Universal Serial Bus Power Delivery Specification", Revision 2.0, V1.0, Aug. 11, 2014, Section 8—Device Policy, Part 1 (pp. 268-350) and Part 2 (pp. 351-450).
"Universal Serial Bus Type-C Cable and Connector Specification", Revision 1.0, Aug. 11, 2014, USB 3.0 Promoter Group, Part 1 (pp. 1-84) and Part 2 (pp. 85-171).
Search Report for PCT Application No. PCT/US16/61881, dated Mar. 16, 2017 (1 page).
Supplementary Partial European Search Report for European Patent Application No. 16865224.6, Date of completion of the search Feb. 8, 2019 (1 page).

* cited by examiner

PORT CONTROLLER WITH POWER CONTRACT NEGOTIATION CAPABILITY

CROSS-REFERENCE TO RELATED APPLICATIONS

The present application claims priority to U.S. Provisional Patent Application No. 62/254,936, which was filed on Nov. 13, 2015, is titled "Type-C Port Controller With Temporary Sink Policy Engine," and is hereby incorporated herein by reference in its entirety.

BACKGROUND

Traditional universal serial bus (USB) systems, which include USB cables and connectors, are typically used to transfer data between multiple electronic devices and to provide low-level power (e.g., at voltage levels of 5 V or less) from a source device to a sink device. Such low-level power transfer enables a small, low-power device—such as a smartphone—to be charged from the battery of a larger device, such as a notebook. However, such low-level power is insufficient to charge larger devices with greater power needs, such as the notebook itself. Thus, such larger devices are relegated to using traditional barreljack (or "power brick") connections to mains power supplies ("wall outlets").

Newer USB Type C systems with power delivery (PD) capability take the traditional USB's power supply capabilities a step further by enabling the sourcing and sinking of power at greater levels (e.g., with voltages greater than 5 V). Thus, for example, appropriately-configured notebooks can use such newer USB systems both to charge smaller devices (as with traditional USB systems) and to be charged from mains power (not possible with traditional USB systems). Such newer USB Type C systems with PD capability eliminate the need for bulky and inconvenient barreljack connections and equipment.

SUMMARY

At least some embodiments are directed to an electronic device port system comprising a first device configured to negotiate power supply contracts from a power source via a universal serial bus (USB) cable. The system also comprises a second device configured to negotiate power supply contracts from the power source via the USB cable when the first device is unable to negotiate power supply contracts from the power source. The second device is configured to activate a switch after the second device negotiates a power supply contract with the power source. The switch is configured to permit the provision of power from the power source to a battery system of the electronic device per the negotiated power supply contract. One or more such embodiments may be supplemented using one or more of the following concepts, in any order and in any combination: wherein the USB cable is a USB Type C cable with power delivery (PD) capability; wherein the first device comprises a Type C port manager; wherein the second device comprises a Type C port controller; wherein the second device is configured to determine that the first device is unable to negotiate power supply contracts based on a rail voltage supply that powers the first device; wherein the system is configured to source power to another electronic device; wherein the switch comprises a metal oxide semiconductor field effect transistor (MOSFET); wherein the second device is configured to negotiate power supply contracts from the power source via a configuration channel (CC) in the USB cable; wherein the power supplied per the negotiated power supply contract is provided to the switch via a pair of dedicated power lines in the USB cable; wherein, upon receipt of the power per the negotiated power supply contract, the battery system powers the first device, and wherein the second device is configured to relinquish power supply contract negotiations to the first device upon a determination that the first device is able to negotiate power supply contracts from the power source.

At least some embodiments are directed to a system comprising a battery system and a DC-to-DC converter coupled to the battery system and configured to provide a rail voltage supply. The system also comprises a port manager powered by the rail voltage supply and configured to negotiate power contracts with a power supply on behalf of the system via a universal serial bus (USB) cable. The system further includes a port controller powered by the power supply via the USB cable and configured to negotiate power contracts with the power supply on behalf of the system via the USB cable when the port controller detects that the port manager is powered below a threshold level, the battery system is powered below another threshold level, or both. One or more such embodiments may be supplemented using one or more of the following concepts, in any order and in any combination: wherein the port controller is configured to determine that the port manager is powered below the threshold level via an inter-integrated circuit (I2C) connection; wherein the port controller is configured to determine that the battery system is powered below the another threshold level via the rail voltage supply; wherein the USB cable is a USB Type C cable with power delivery (PD) capability; wherein the power supply is a mains power adapter; wherein the power supply is a portable electronic device; wherein the system comprises a second port controller configured to negotiate power contracts with the power supply on behalf of the system via the USB cable when the second port controller detects that the port manager is powered below the threshold level, the battery system is powered below the another threshold level, or both, and wherein the second port controller negotiates a power contract with the power supply only when the port controller provides a permission indication to the second port controller.

At least some embodiments are directed to a method comprising using a device to negotiate power supply contracts from a power source via a data and power transmission cable, determining that the device is not receiving power meeting a minimum threshold, reviewing power supply options received from the power source via the data and power transmission cable, selecting one of the received power supply options, providing the power source with an indication of the selection, receiving power from the power source in accordance with the selection, and establishing an electrical pathway between the power source and a battery system. One or more such embodiments may be supplemented using one or more of the following concepts, in any order and in any combination: wherein the device comprises a USB Type C port manager; wherein establishing the electrical pathway between the power source and the battery system comprises closing a p-type metal oxide semiconductor field effect transistor (MOSFET) switch and closing an n-type MOSFET serially coupled to the p-type MOSFET.

BRIEF DESCRIPTION OF THE DRAWINGS

For a detailed description of various examples, reference will now be made to the accompanying drawings in which.

DETAILED DESCRIPTION

To facilitate the sourcing and sinking of higher-than-traditional power levels via a USB Type C with PD capability, the USB ports (e.g., ports in a notebook and in a USB wall adapter, or ports in a notebook and in a smaller electronic device) must negotiate a power contract, meaning that the source (e.g., mains power USB adapter) must offer the sink (e.g., notebook USB port system) one or more power levels to choose from, and the sink must choose from among the available power levels and start sinking the power. Such power negotiation is considered to be a higher-order task and is thus typically performed by an embedded controller (and/or by another processor, such as a system-on-chip (SoC) or application processor (AP)).

At least some of the embodiments described herein are directed to a USB Type C/PD-compatible electronic device port system that is configured to execute power negotiations when the embedded controller (or other processor) that is typically responsible for power negotiations is temporarily incapacitated. More specifically, in some cases, the electronic device battery system may be completely discharged and, as a result, the embedded controller inside the electronic device port system may be unavailable to negotiate a power contract with an adapter that is capable of supplying power to the electronic device. In such situations, a port controller—which is typically not responsible for higher-level functions like power contract negotiations—determines that the embedded controller is incapacitated and takes over power negotiation duties until the embedded controller is powered again. Once the embedded controller is powered again and is able to conduct power contract negotiations, the port controller relinquishes its power contract negotiation duties back to the embedded controller. This technique reduces the amount of time required to negotiate a power contract for the electronic device and reduces downtime for the embedded controller and for the electronic device in general.

Figure 1:
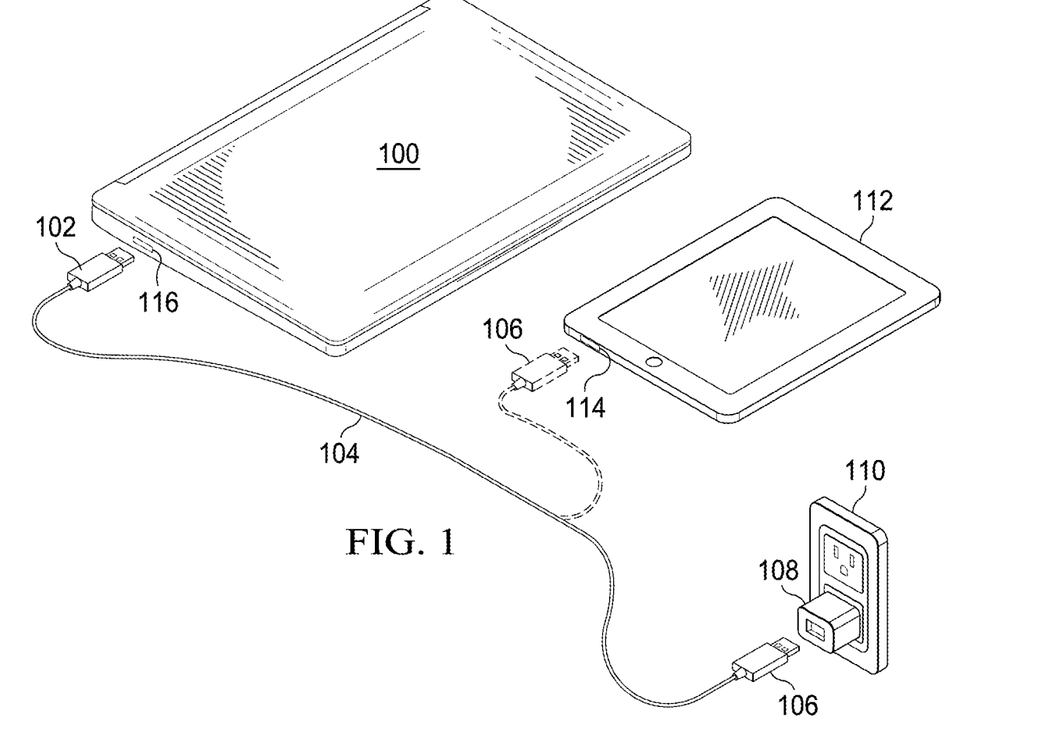
FIG. 1 is a perspective view of an illustrative electronic device configured to source power from mains power via a USB Type C system with PD capability and further configured to sink power to another electronic device via the same USB system.

FIG. 1 is a perspective view of an illustrative electronic device configured to source power from mains power via a USB Type C system with PD capability and further configured to sink power to another electronic device via the same USB system. Specifically, FIG. 1 depicts an electronic device 100 adapted for coupling to a USB Type C/PD cable 104 having connectors 102, 106 disposed on opposing ends of the cable. The depiction of the electronic device 100 as a notebook computer is merely illustrative; in other embodiments, the electronic device 100 may take the form of any of a variety of other battery-powered electronic devices, such as and without limitation, laptops, tablets (e.g., IPADs®), smartphones, portable music players, and any other battery-powered electronic device compatible with both USB Type C and PD specifications. The contents of the USB cable 104 are depicted and described in greater detail with respect to FIG. 2.

The electronic device 100 comprises a USB Type C/PD port 116 to which the connector 102 may couple. The connector 106 at the opposing end of the USB cable 104 may couple to a variety of devices. For instance, the connector 106 may couple to a mains power adapter 108 that plugs into and sinks power from a wall outlet 110. In this configuration, a port system within the electronic device 100 communicates with the mains power adapter 108 to negotiate a power contract whereby the mains power adapter 108 sources power to the port system and, more generally, to the entire electronic device 100. In another configuration, the connector 106 couples to a USB Type C/PD port 114 in an electronic device 112. (In some embodiments, the USB cable 104 may be hard-wired directly to the electronic device 100 and/or the electronic device 112.) FIG. 1 depicts the electronic device 112 as a tablet, but the electronic device 112 is any portable, battery-operated electronic device capable of being charged by the electronic device 102 via the USB Type C/PD cable 104. In this configuration, the USB port system in the electronic device 102 communicates with the USB port system within the electronic device 112 to negotiate a power contract whereby the electronic device 102 sources power to the electronic device 112.

As will be described in greater detail below, USB Type C/PD port systems in the electronic devices depicted in FIG. 1—for instance, in the electronic device 100—comprise Type C port managers (TCPMs, such as embedded controllers, systems on chip and/or application processors) that handle higher-level operations for the port system, such as power contract negotiations with other electronic devices via the USB Type C/PD cable. Each port manager manages one or more port controllers, with each port controller typically controlling a single port. Thus, in multi-port devices, a port manager may manage multiple port controllers. Port controllers typically handle lower-level operations for corresponding ports, such as routing and managing incoming power and data, outgoing power and data, etc.

Port managers are powered directly with voltage supply rails received directly or indirectly from the electronic device battery. When the battery is dead or the battery charge drops below a threshold value, the port manager is no longer able to perform power contract negotiations with other electronic devices, and it goes offline because its power level drops below a threshold value. In such a situation where the port manager is temporarily incapacitated, the port controller for a port managed by the port manager may "step up" and take over power contract negotiation duties for the port manager. Upon negotiation of a power contract with an external electronic device, the port controller may establish an electrical pathway between the external electronic device and the dead battery that is responsible for supplying power to the port manager. In this way, the port manager is powered up again, and the port controller then relinquishes its power contract negotiation duties back to the port manager. In devices with multiple port controllers, the controllers may determine among themselves which controller will handle power contract negotiations.

Figure 2:
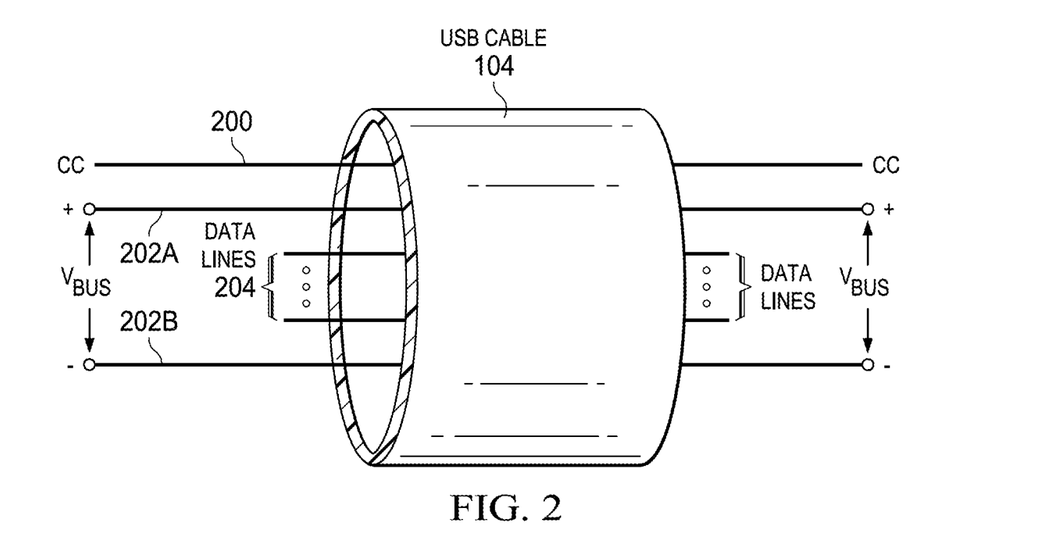
FIG. 2 is an illustrative, schematic diagram of at least some of the contents of a cable in a USB Type C system with PD capability.

FIG. 2 is an illustrative, schematic diagram of at least some of the conductors within the USB Type C/PD cable 104 (the cable 104 is also depicted in FIG. 1). The cable 104 includes a configuration channel (CC) 200, a pair of power lines ($V_{BUS}$) 202A and 202B, and a plurality of data lines 204. The CC line 200 may be dedicated to communications relating to power contract negotiations. The power lines 202A, 202B may be dedicated to sourcing and/or sinking power. The data lines 204 may be dedicated to transferring data (e.g., text-based files, audio files, video files). The USB cable 104 and its connectors (shown in FIG. 1 but omitted from FIG. 2) support both the Type C and PD specifications. The scope of disclosure is not limited to implementing the disclosed concepts in the USB Type C/PD context, however, and the disclosed concepts may be extended to any current or future USB specification(s) in which power contract negotiations occur.

Figure 3:
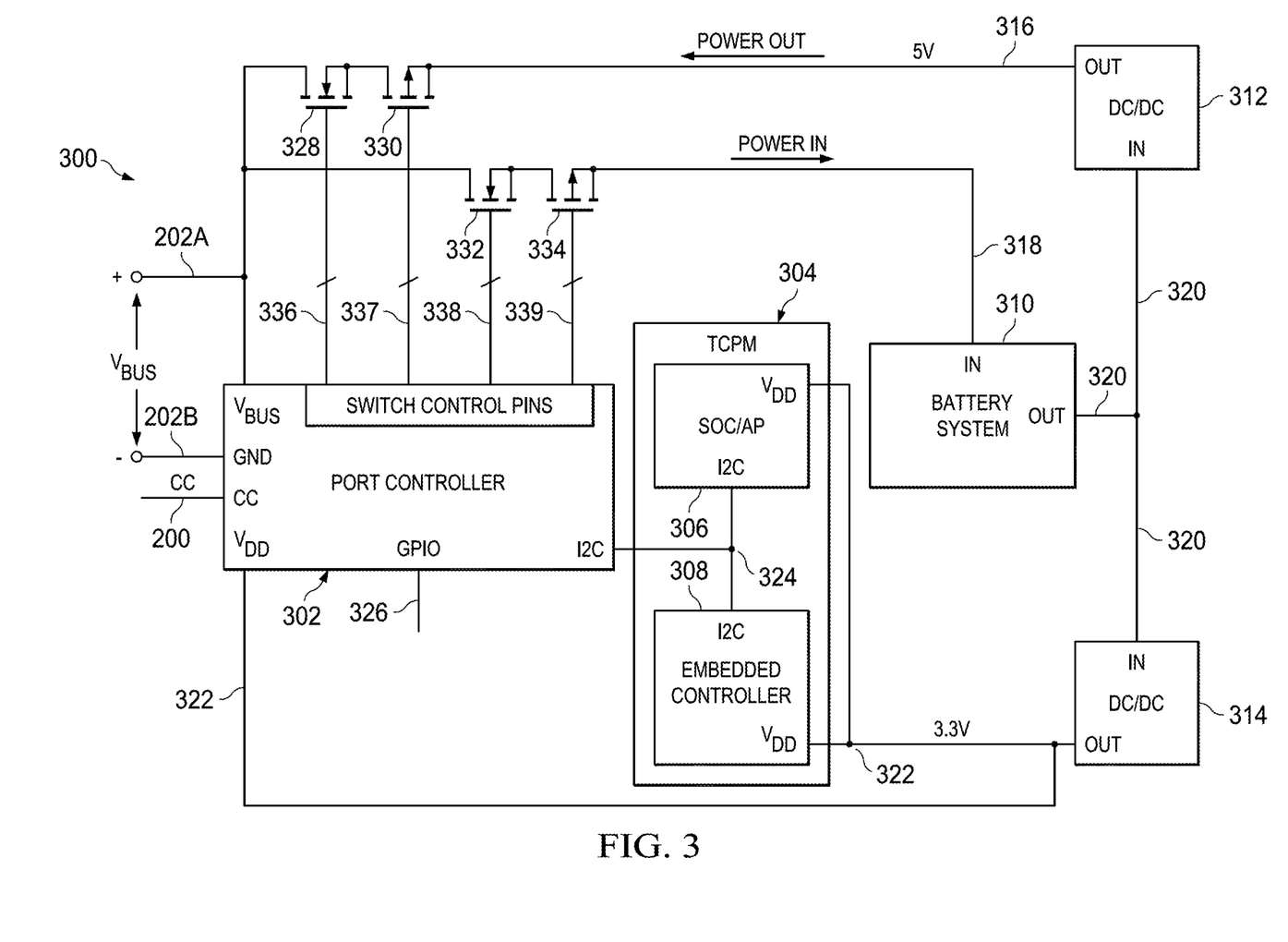
FIG. 3 is a schematic block diagram of an illustrative electronic device port system that is compatible with a USB Type C system with PD capability.

FIG. 3 is a schematic block diagram of an illustrative electronic device port system that supports the USB Type C/PD specifications (or, alternatively, suitable USB specification(s) that enable power contract negotiations). Specifically, FIG. 3 depicts a port system 300 that includes a port controller 302; a Type C power manager (TCPM) 304 that comprises an embedded controller (EC) 308 and/or a system-on-chip (SoC) and/or application processor (AP) 306; a battery system 310; a DC/DC converter 312; another DC/DC converter 314; an inbound power line 316; an outbound power line 318; a node 320 connecting the battery system 310 and the DC/DC converters 312, 314; a node 322 coupling EC 308, DC/DC converter 314, the SoC/AP 306, and the port controller 302; a node 324 coupling the SoC/AP 306, the EC 308, and the port controller 302; a general-purpose input/output (GPIO) connection 326; an n-type metal oxide semiconductor field effect transistor (MOSFET) 328; a p-type MOSFET 330 serially coupled with the MOSFET 328; an n-type MOSFET 332; a p-type MOSFET 334 serially coupled with the MOSFET 332; and MOSFET controls 336-339. In some embodiments, multiple, serially-coupled n-type MOSFETs and/or multiple, serially-coupled p-type MOSFETs may be used.

The port controller 302 comprises any suitable logic (e.g., hardware, software and/or firmware) that enables the port controller 302 to perform the various actions attributed herein to the port controller 302. Similarly, the SoC/AP 306 and the EC 308 comprise suitable logic (e.g., hardware, software, and/or firmware) that enables the SoC/AP 306 and the EC 308 to perform the various actions attributed herein to the SoC/AP 306 and the EC 308. The battery system 310 may receive voltage and current at varying levels on the inbound power line 318 (e.g., 9 V and 2 A; 12 V and 1 A). The voltage level on the node 320 may be at any of a variety of levels (e.g., 9 V). The DC/DC converter 312 may step the voltage on node 320 down to, e.g., 5 V on outbound power line 316. The outbound power line 316 may be used to source power from the battery system 310 to other electronic devices via MOSFETs 328, 330. Similarly, the DC/DC converter 314 may step the voltage on node 320 down to, e.g., 3.3 V on voltage rail supply 322. The voltage rail supply 322 is provided to the EC 308 via pin $V_{DD}$, to the SoC/AP 306 via pin $V_{DD}$, and to the port controller 302 via pin $V_{DD}$. Node 324 couples to the SoC/AP 306 via the inter-integrated circuit (I2C) pins, to the EC 308 via the I2C pins, and to the port controller 302 via the I2C pins, thus enabling these three components to communicate with each other. The port controller 302 couples to the CC line 200 via the CC pin and the $V_{BUS}$ power line via the $V_{BUS}$ and GND pins. The port controller 302 outputs the MOSFET controls 336-339 via the switch control pins.

Figure 4:
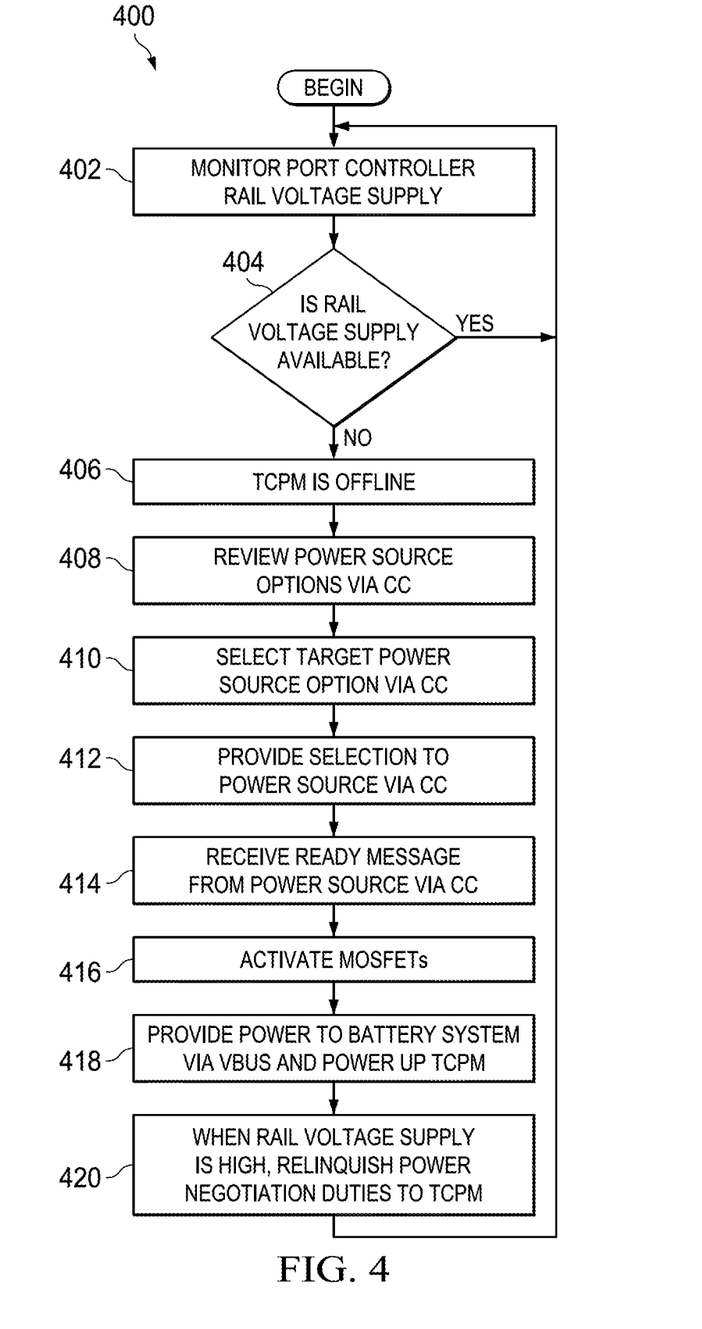
FIG. 4 is a flow diagram of an illustrative process in accordance with various embodiments.

The operation of the port system 300 of FIG. 3 is now described in tandem with the illustrative process 400 of FIG. 4. The process 400 begins with monitoring the port controller rail voltage supply (block 402) and determining whether the rail voltage supply is available (block 404). The port controller 302 may perform this step. The port controller 302 monitors the rail voltage supply 322 on the $V_{DD}$ pin for a supply voltage that drops below a predetermined threshold. For example, in some embodiments, the port controller 302 may include or be coupled to a voltage comparator that compares the rail voltage supply 322 to a reference voltage (e.g., the predetermined threshold) and uses the output of the voltage comparator to determine the status of the rail voltage supply 322. If the rail voltage supply drops below the threshold, the TCPM 304—which is powered only by the rail voltage supply—is offline. As a result, the TCPM 304—and, more specifically, its constituent components, the SoC/AP 306 and/or the EC 308—are unable to negotiate power contracts contracts (or, if a previous contract has been negotiated, these components are unable to negotiate a new power contract when necessary). Alternatively or in addition, the port controller 302 may monitor the status of the SoC/AP 306 and/or the EC 308 directly via the I2C node 324 (for example and without limitation, through periodic heartbeat signals sent by the SoC/AP 306 and/or the EC 308, or through responses to periodic heartbeat signals sent by the port controller 302). If attempts to communicate with either of these components are unsuccessful, the port controller 302 may conclude that they are insufficiently powered (i.e., below a predetermined threshold) and are thus offline. If the component among the SoC/AP 306 and the EC 308 that is responsible for negotiating power contracts is offline, then the TCPM 304 is considered to be unable to negotiate power contracts. Thus, regardless of whether the port controller 302 uses the rail voltage supply 322 and/or the I2C 324, if the port controller 302 determines that the SoC/AP 306 or the EC 308 (whichever is responsible for negotiating power contracts) is offline, the port controller 302 determines that the TCPM is likely offline for power contract negotiation purposes (block 406).

The illustrative method 400 may continue by requesting and reviewing the power source options presented by another, external electronic device via the CC pin (block 408). This step may be performed, for example, by the port controller 302. Specifically, the port controller 302—upon determining that the TCPM 304, which is usually responsible for power contract negotiations, is offline—communicates with the electronic device to which the port system 300 is coupled via the CC 200 to begin negotiations for receiving power via the CC 200. For instance, if the port system 300 is housed within a notebook computer, the CC 200 may couple to a mains power adapter, such as the adapter 108 depicted in FIG. 1. Similarly, if the port system 300 is housed within a smartphone, the CC 200 may couple to a laptop computer or to a mains power adapter. Regardless of the nature of the external electronic device to which the CC 200 couples, it is assumed that the electronic device is compatible with USB Type C/PD specifications. Accordingly, the port controller 302 and the external electronic device negotiate for a power contract via the CC 200. Specifically, the electronic device—in some embodiments, upon request—presents the port controller 302 with a plurality of power supply options from which to choose. For instance, the electronic device may present the port controller 302 a first voltage at a first current, a second voltage at the first current, a third voltage at a second current, etc.

The method 400 subsequently comprises selecting a target power source option via the CC 200 (block 410). The port controller 302 may perform this step. The port controller 302 may be pre-programmed with specific voltage and current combinations that are acceptable for charging the battery system 310. The port controller 302 selects an option from the power options offered by the external electronic device to which the CC 200 couples based on the preferences pre-programmed into the port controller 302. If a preferred voltage and current combination is not offered via the CC 200, the port controller 302 may choose the option that most closely approximates the preferred or acceptable options pre-programmed into the port controller 302. The port controller 302 may notify the electronic device of its selection via the CC 200 (block 412). The steps 408, 410, and 412 thus are parts of the power contract negotiation process.

The process 400 next comprises receiving a ready message from the electronic device via the CC 200 when the electronic device is ready to act as a power supply to the battery system 310 (block 414). The port controller 302 receives the ready message from the external electronic device via the CC 200. At this time, the port system 300 may begin sinking power from the external electronic device. Accordingly, upon receiving the ready message, the port controller 302 activates the MOSFETs 332, 334 using MOSFET controls 338, 339 (block 416). The MOSFET controls 338, 339 comprise connections to the gates and sources of the MOSFETs via which $V_{gs}$ voltages may be applied that activate the MOSFETs 332, 334. The port controller 302 may also ensure that the MOSFETs 328, 330 are off at this time using the MOSFET controls 336, 337.

Activating the MOSFETs 332, 334 facilitates sinking power from the external electronic device, through the $V_{BUS}$ power lines 202A, 202B, through the inbound power line 318, and to the battery system 310. In this way, the battery system 310 is charged and, by extension, the TCPM 304 is powered via the DC/DC converter 314 (block 418). Once the battery system 310 is adequately charged such that the rail voltage supply 322 is determined to be above the predetermined threshold by the port controller 302, or if the port controller 302 determines via the I2C node 324 that the SoC/AP 306 and/or the EC 308 (whichever is responsible for conducting power contract negotiations) is powered again, the port controller 302 relinquishes its power contract negotiation duties to the TCPM 304 (and, more specifically, to whichever of the SoC/AP 306 and/or EC 308 is typically responsible for negotiating power contracts) (block 420). The port controller 302 may relinquish these duties using, e.g., one or more messages transmitted via the I2C pin and node 324.

In the event that multiple port controllers are present in the port system, the port controllers may communicate with each other via the GPIO 326 so that efforts to power the battery system 310 are not duplicated by the multiple port controllers. For example, a first port controller may send a permission indication to a second port controller indicating that the second port controllers may or may not engage in negotiating power contracts and manipulating MOSFET switches to create an electrical pathway between power source and battery system. In some embodiments, one of the port controllers may be designated as a master port controller and the remaining port controllers may be designated as slave port controllers, meaning that the master port controller uses permission indications to dictate which port controller will negotiate power contracts. This designation may occur, e.g., as a pre-programmed feature or at the direction of the port manager (e.g., TCPM 304 of FIG. 3). The method 400 may be modified as desired, including by adding, deleting, modifying, or rearranging one or more steps.

Figure 5:
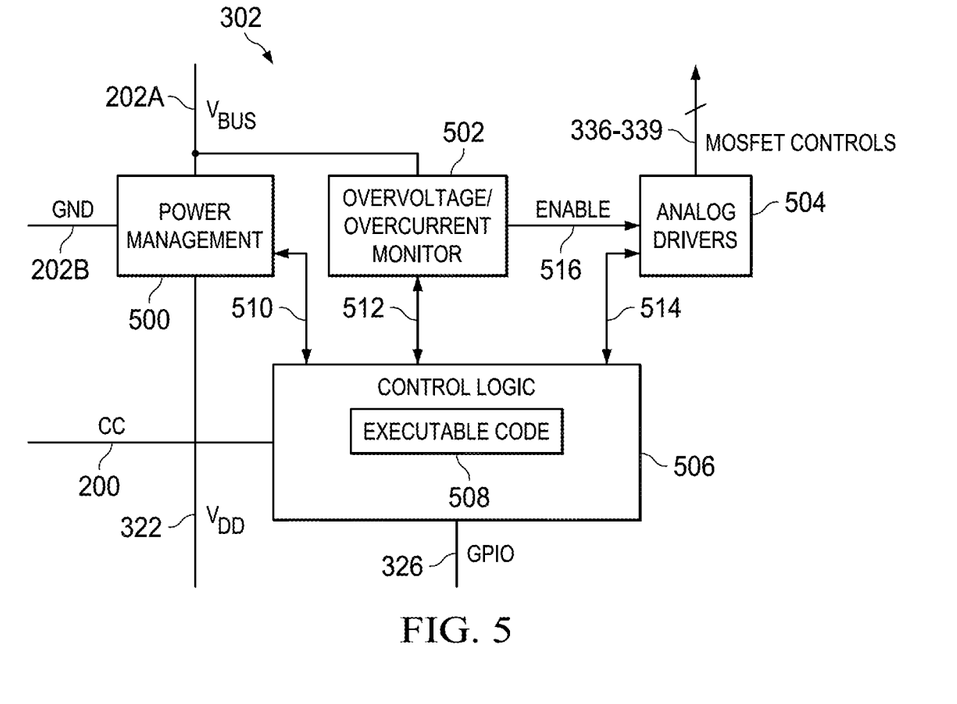
FIG. 5 is an illustrative, schematic block diagram of the port controller depicted in FIG. 3.

FIG. 5 is an illustrative, schematic block diagram of the port controller 302 depicted in FIG. 3. The port controller 302 includes a power management component 500; an overvoltage/overcurrent protection monitor 502; analog drivers 504; and control logic 506. The control logic 506 includes executable code 508 (e.g., software, firmware) and any other hardware necessary to perform the actions attributed herein to the control logic 506. The power management component 500 receives the $V_{BUS}$ power line 202A, $V_{DD}$ 322, and ground line 202B. The $V_{BUS}$ power line 202A is also provided to the monitor 502, which, in turn, provides an enable signal to analog drivers 504. Analog drivers 504 issue MOSFET controls 336-339, which are used to activate and deactivate the MOSFETs 328, 330, 332, and 334 (FIG. 3). The control logic 506 receives CC 200 and GPIO 326. Further, the control logic 506 couples to the power management component 500 via bus 510, to the monitor 502 via bus 512, and to analog drivers 504 via bus 514.

In operation, the control logic 506 negotiates power contracts via CC 200. The control logic 506 also manages the actions of the power management component 500, the monitor 502, and the analog drivers 504. The power management 500 receives power via power lines 202A, 202B and communicates information about the received power to the control logic 506 via bus 510. The analog drivers 504 activate and deactivate the MOSFETs using MOSFET controls 336-339 at the direction of the control logic 506, depending on whether a power contract has been successfully negotiated. If an excessive amount of voltage or current is supplied (e.g., voltage or current exceeding defined thresholds), the monitor 502 signals the analog drivers 504 via bus 516 to disable the MOSFETs 332, 334 (FIG. 3). This action protects the port system from the deleterious effects of overvoltage and overcurrent situations. In addition, the control logic 506 issues and receives communications from the control logic of other port controllers via GPIO 326.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. An electronic device port system, comprising:
a first device configured to negotiate power supply contracts for the electronic device port system from a power source external to the electronic device port system via a universal serial bus (USB) cable; and
a second device configured to negotiate power supply contracts for the electronic device port system from the power source external to the electronic device port system via the USB cable when the first device is unable to negotiate power supply contracts from the power source,
wherein the second device is configured to activate a switch within the electronic device port system after the second device negotiates a particular power supply contract with the power source, the switch configured to permit a provision of power from the power source external to the electronic device port system via the USB cable to a battery system of the electronic device port system per the negotiated particular power supply contract.

2. The electronic device port system of claim 1, wherein the USB cable is a USB Type C cable with power delivery (PD) capability.

3. The electronic device port system of claim 1, wherein the first device comprises a Type C port manager.

4. The electronic device port system of claim 1, wherein the second device comprises a Type C port controller.

5. The electronic device port system of claim 1, wherein the second device is configured to determine that the first device is unable to negotiate power contracts based on a rail voltage supply that powers the first device.

6. The electronic device port system of claim 1, wherein the electronic device port system is configured to source power to another electronic device external to the electronic device port system.

7. The electronic device port system of claim 1, wherein the switch comprises a metal oxide semiconductor field effect transistor (MOSFET).

8. The electronic device port system of claim 1, wherein the second device is configured to negotiate power supply contrasts from the power source via a configuration channel (CC) in the USB cable.

9. The electronic device port system of claim 8, wherein the power supplied per the negotiated power supply contracts is provided to the switch via a pair of dedicated power lines in the USB cable.

10. The electronic device port system of claim 1, wherein, upon receipt of the power per the particular negotiated power supply contract, the battery system powers the first device, and wherein the second device is configured to relinquish power supply contract negotiations to the first device upon a determination that the first device is able to negotiate power supply contracts from the power source.

11. A system, comprising:
a battery system;
a DC-to-DC converter coupled to the battery system and configured to provide a rail voltage supply;
a port manager powered by the rail voltage supply and configured to negotiate power contracts with a power supply on behalf of the system via a universal serial bus (USB) cable; and
a port controller powered by the power supply via the USB cable and configured to negotiate power contracts with the power supply on behalf of the system via the USB cable when the port controller detects that the port manager is powered below a threshold level, the battery system is powered below another threshold level, or both.

12. The system of claim 11, wherein the port controller is configured to determine that the port manager is powered below the threshold level via an inter-integrated circuit (I2C) connection.

13. The system of claim 11, wherein the port controller is configured to determine that the battery system is powered below the another threshold level via the rail voltage supply.

14. The system of claim 11, wherein the USB cable is a USB Type C cable with power delivery (PD) capability.

15. The system of claim 11, wherein the power supply is a mains power adapter.

16. The system of claim 11, wherein the power supply is a portable electronic device.

17. The system of claim 11, wherein the system comprises a second port controller configured to negotiate power contracts with the power supply on behalf of the system via the USB cable when the second port controller detects that the port manager is powered below the threshold level, the battery system is powered below the another threshold level, or both, and wherein the second port controller negotiates a power contract with the power supply only when the port controller provides a permission indication to the second port controller.

18. A method, comprising:
using a first device to negotiate power supply contracts from a power source via a data and power transmission cable;
determining that the first device is not receiving power meeting a minimum threshold so that the first device is unable to negotiate power supply contracts;
using a second device, reviewing power supply options received from the power source via the data and transmission cable;
using the second device, selecting one of the power supply options received from the power source;
using the second device, providing the power source with an indication of one of the power supply options received from the power source selected;
receiving power from the power source in accordance with the selection; and
using the second device, establishing an electrical pathway between the power source and a battery system.

19. The method of claim 18, wherein the first device comprises a USB Type C port manager.

20. The method of claim 18, wherein establishing the electrical pathway between the power source and the battery system comprises closing a p-type metal oxide semiconductor field effect transistor (MOSFET) and closing an n-type MOSFET serially coupled to the p-type MOSFET.

* * * * *